United States Patent [19]
Lee

[11] Patent Number: 5,808,692
[45] Date of Patent: Sep. 15, 1998

[54] HORIZONTAL OSCILLATION CIRCUIT FOR A MONITOR

[75] Inventor: Moon-Geol Lee, Seoul, Rep. of Korea

[73] Assignee: Daewoo Electronics Co., Ltd., Seoul, Rep. of Korea

[21] Appl. No.: 565,171

[22] Filed: Nov. 30, 1995

[30] Foreign Application Priority Data

Nov. 30, 1994 [KR] Rep. of Korea ............... 94-32041

[51] Int. Cl.⁶ ................................ H04N 5/12; H03L 7/00
[52] U.S. Cl. .................... 348/542; 348/543; 315/364; 315/370
[58] Field of Search ............................ 348/540, 541, 348/542, 543, 544, 510, 554, 555, 556; 315/411, 408, 364, 379, 370; 331/20; H04N 5/12, 7/08

[56] References Cited

U.S. PATENT DOCUMENTS

| | | | |
|---|---|---|---|
| 3,794,760 | 2/1974 | Moriki | 348/540 |
| 4,612,574 | 9/1986 | Barnes | 348/542 |
| 4,679,091 | 7/1987 | Kikuchi et al. | 348/543 |
| 4,891,608 | 1/1990 | Ikeda | 348/540 |
| 5,610,663 | 3/1997 | Nan et al. | 348/554 |

*Primary Examiner*—Michael H. Lee
*Attorney, Agent, or Firm*—Beveridge, DeGrandi, Weilacher & Young, LLP

[57] ABSTRACT

Disclosed is a horizontal oscillation circuit for a monitor performing a stable oscillation even at the start input such as a power input or a mode change. The horizontal oscillation circuit for a monitor includes an operation voltage delaying part for delaying a time period for an operating voltage to reach a voltage level and for outputting a delayed operating voltage, and a horizontal oscillator for inputting the voltage corresponding to the operating mode, the horizontal synchronizing signal and the delayed operating voltage and for outputting a stable oscillation voltage corrresponding to the operating mode. With an output of a stable oscillation voltage from the horizontal oscillation circuit, the horizontal output circuit of a monitor can be protected from being damaged by heat and a stable display can be obtained even at the start input such as a power input or a mode change.

12 Claims, 6 Drawing Sheets

FIG.4
PRIOR ART
(A)
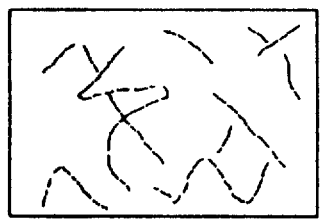
(B)
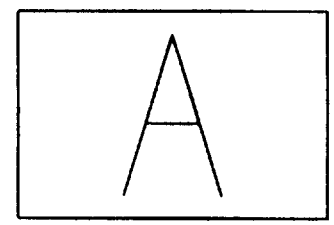

5,808,692

HORIZONTAL OSCILLATION CIRCUIT FOR A MONITOR

BACKGROUND OF THE INVENTION

1. Field of the Invention

The present invention relates to a monitor, and more particularly to a horizontal oscillation circuit for a monitor.

2. Description of the Prior Art

FIG. 1 is a block diagram for showing a monitor with a conventional horizontal oscillator. As shown in FIG. 1, reference numeral 5 indicates a main computer. Main computer 5 outputs a frequency F corresponding to a user's input mode such as a text mode and a graphic mode. A monitor 10 comprises a microprocessor 11. Microprocessor 11 outputs a voltage F/V, which is an input mode voltage for selecting a mode, corresponding to frequency F inputted thereto. Voltage F/V is inputted to a horizontal oscillator 12. An IC chip such as a HITACHI HA11235 or a DAEWOO DBL2009 available in the market can be used as oscillator 12. An operating voltage Vdc, voltage F/V, and a horizontal synchronizing signal Hsync are applied to horizontal oscillator 12. Horizontal oscillator 12 outputs an oscillatiing voltage coresponding to voltage F/V. The oscillating voltage is inputted to a horizontal driver 13. Horizontal driver 13 generates current according to the oscillating voltage inputted thereto. A horizontal output circuit 14 is driven with an application of the current. Horizontal output circuit 14 supplies a horizontal deflection yoke of CRT (not shown) with a required current for a horizontal deflection. Such a monitor having a conventional horizontal oscillator is disclosed in U.S. Pat. No. 4,795,946 granted to Mikio Nishiyama.

FIG. 2 is a view for showing a relationship between input mode voltage F/V and operating voltage Vdc both of which are applied to conventional horizontal oscillator 12, and FIG. 3 is a view for showing waveforms outputting from horizontal oscillator 12 under the relationship between the two voltages shown in FIG. 2. FIG. 8 is a view for showing an operating voltage which is applied to horizontal oscillator 12. Horizontal oscillator 12 performs an abnormal oscillation on a power input or a mode change (refer to "START SECTION" in FIG. 2 and to FIG. 3) since input mode voltage F/V is lower than operating voltage Vdc so that horizontal oscillator 12 is operated according to operating voltage Vdc rather than input mode voltage F/V. Such an abnormal oscillation causes current to excessively flow to horizontal output circuit 14, to thereby cause damage to horizontal output circuit 14 by heat. FIG. 4 is a view for showing displays on a monitor screen according to the waveforms of FIG. 3. The abnormal oscillation of horizontal oscillator 12 makes a disfigured display or nothing on a screen (see (A) of FIG. 4). (B) of FIG. 4 shows a normal display on a screen when horizontal oscillator 12 is operated in a normal oscillation. Throughout the specification, operation voltage Vdc indicates a voltage having a waveform as shown in FIG. 8 or a direct voltage required for activating horizontal oscillator 12 depending upon the context. The term "level" is used in particular under necessity to emphasize the direct voltage required for activating horizontal oscillator 12.

SUMMARY OF THE INVENTION

Therefore, it is an object of the present invention to provide a horizontal oscillation circuit for a monitor for performing a stable oscillation even at the start such as on a power input or on a mode change.

To accomplish the above object, a horizontal oscillation circuit according to the present invention includes an operation voltage delaying part for delaying a time period for an operating voltage to reach a voltage level and for outputting a delayed operating voltage, and a horizontal oscillator for inputting an operating mode voltage, a horizontal synchronizing signal and the delayed operating voltage and for outputting a stable oscillation voltage corrresponding to the operating mode.

According to a preferable embodiment for the present invention, since the delayed operating voltage activates the horizontal oscillator after an operating mode is inputted to the horizontal oscillator, the horizontal oscillator outputs a stable oscillation voltage.

Therefore, it is possible to protect a horizontal output circuit at the start from being damaged thereto and to obtain a stable display on a screen even at the start.

BRIEF DESCRIPTION OF THE DRAWINGS

The obove objects and other advantages of the present invention will become more apparent by describing in detail a preferred embodiment thereof with reference to the attached drawings in which:

FIG. 4 is a view for showing displays on a monitor screen according to the waveforms of FIG. 3;

DETAILED DESCRIPTION OF THE INVENTION

An embodiment of the present invention will be explained in detail with reference to the accompanying drawings.

Figure 1:
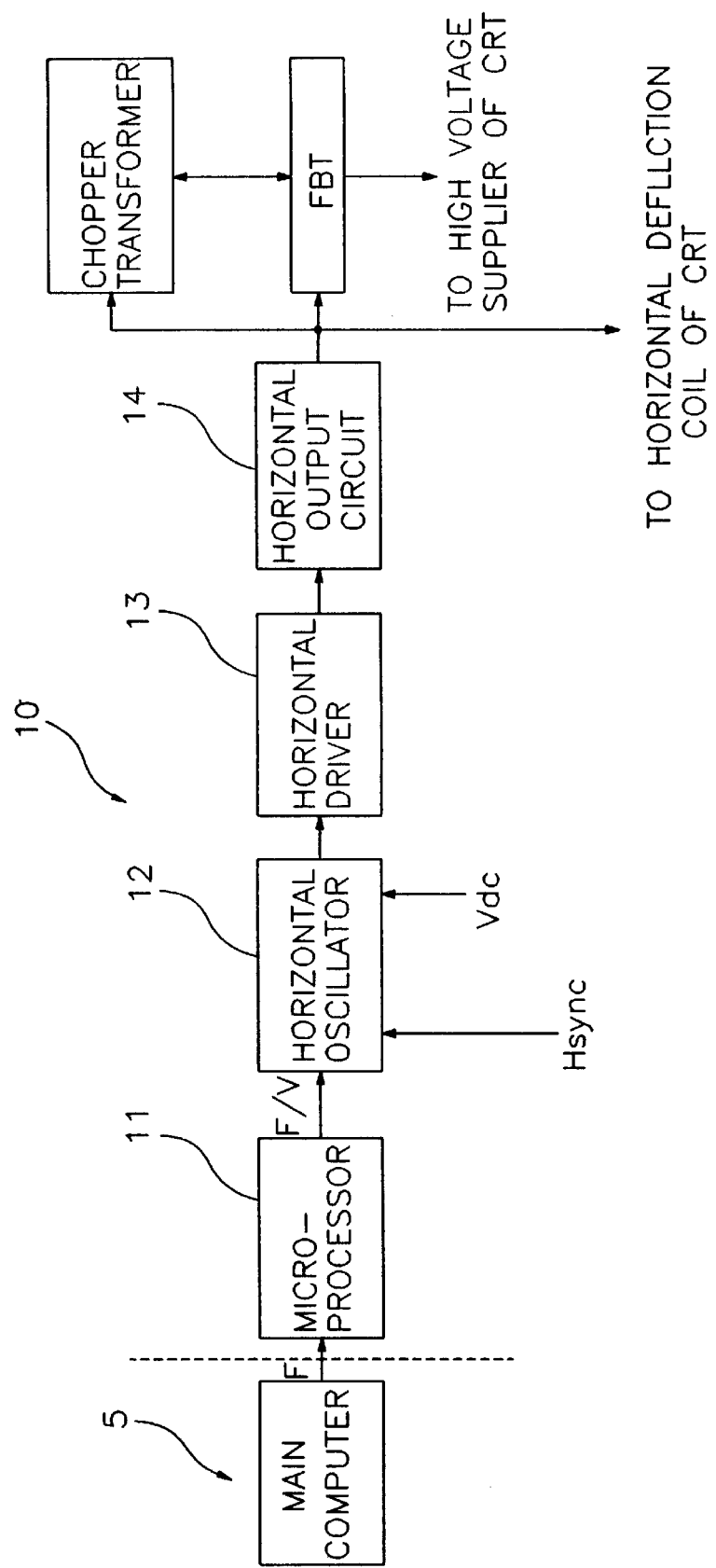
FIG. 1 is a block diagram for showing a monitor with a conventional horizontal oscillator.
Figure 2:
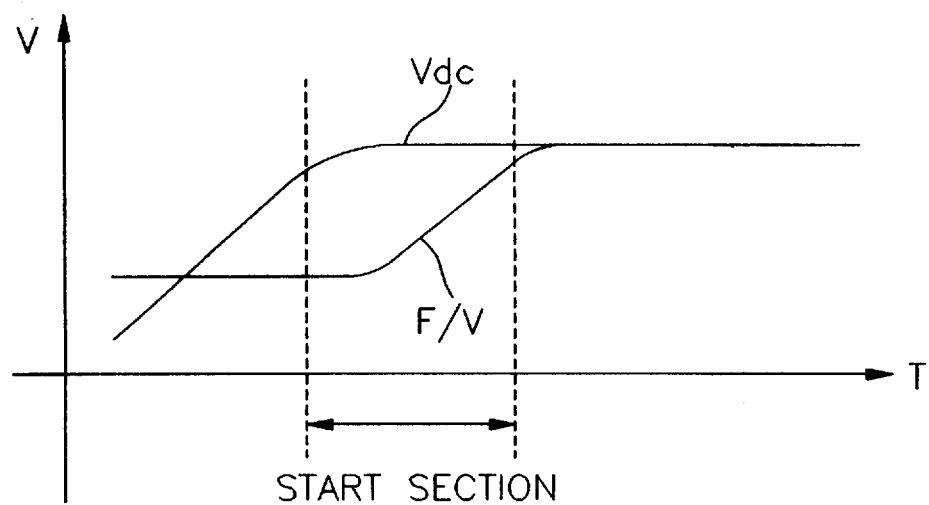
FIG. 2 is a view for showing a relationship between an input mode voltage F/V and an operating voltage Vdc both of which are applied to conventional horizontal oscillator.
Figure 3:
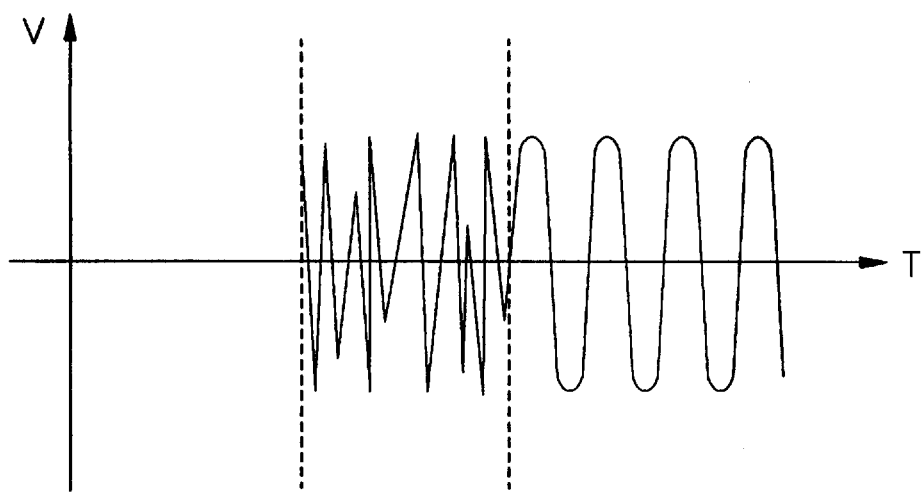
FIG. 3 is a view for showing waveforms outputting from the conventional horizontal oscillator under the relationship between the two voltages shown in FIG. 2.
Figure 5:
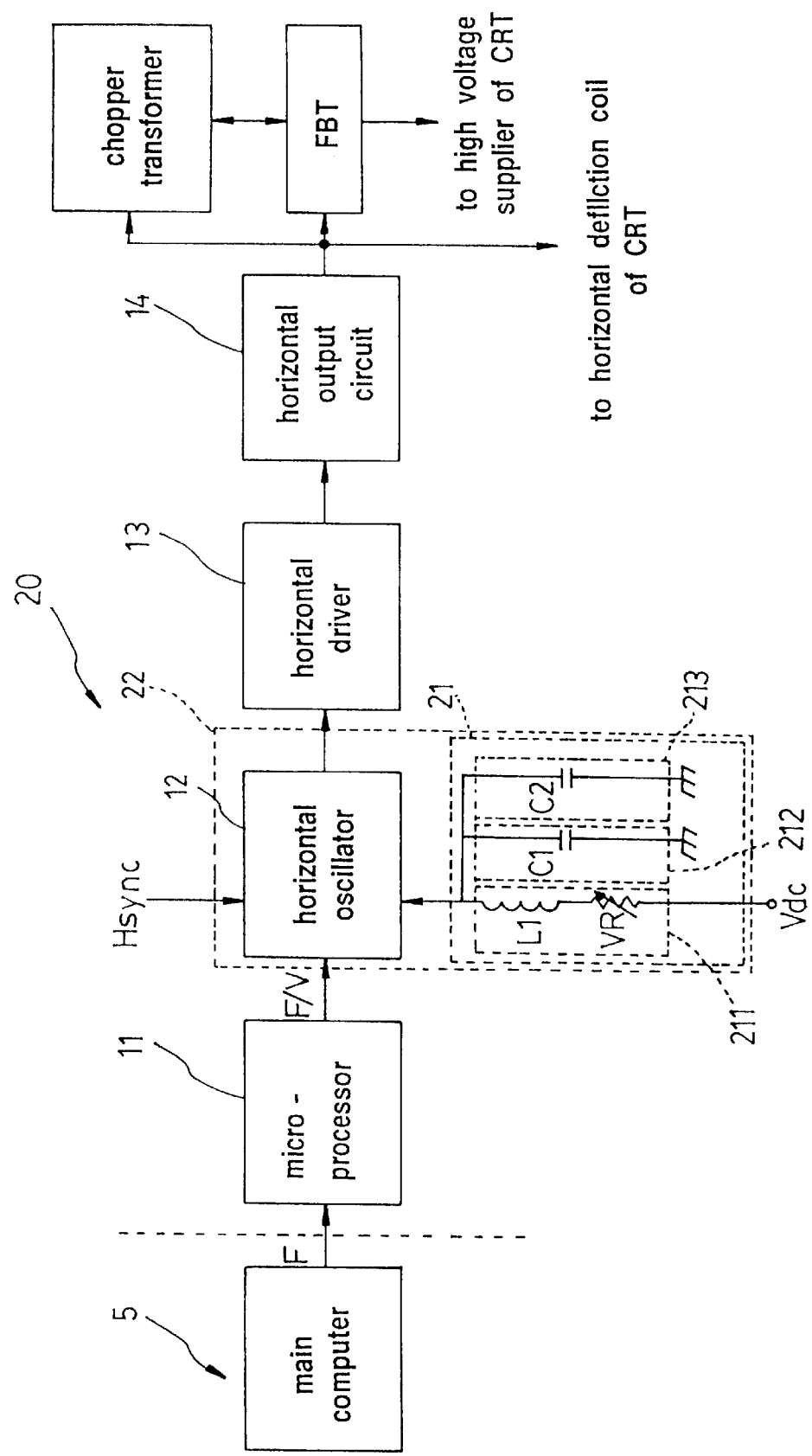
FIG. 5 is a block diagram for showing a monitor with a horizontal oscillation circuit according to an embodiment of the present invention.
Figure 8:
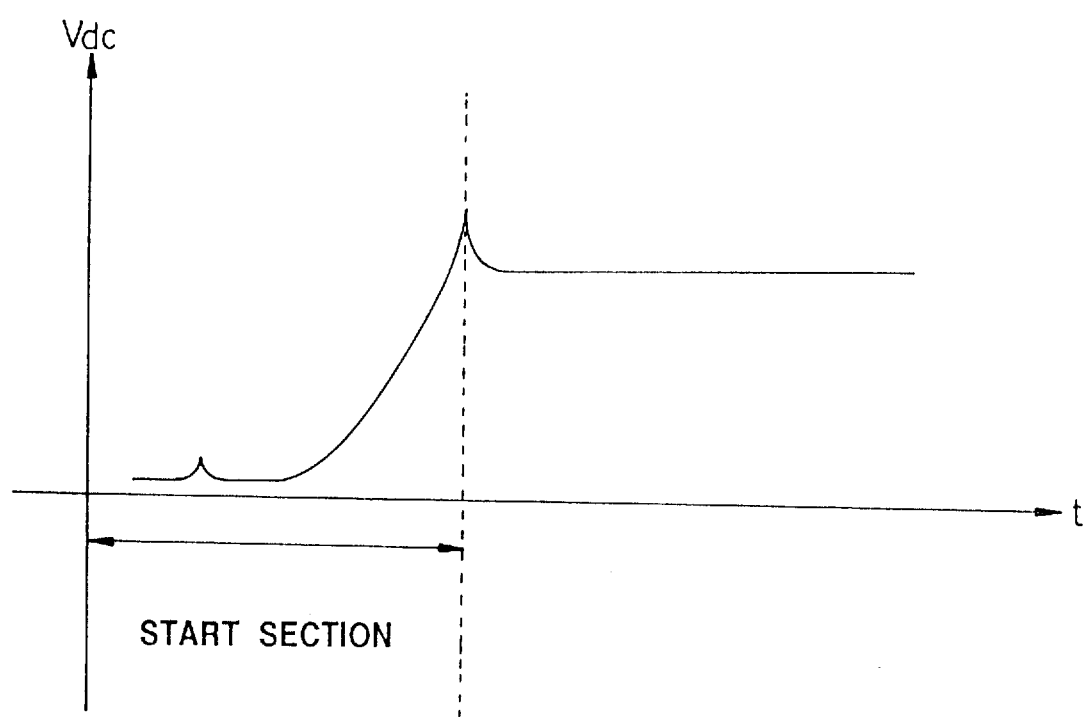
FIG. 8 is a view for showing an operating voltage in detail which is applied to horizontal oscillator of FIG. 1 and to horizontal oscillation circuit of FIG. 5.

FIG. 5 is a block diagram for showing a monitor with a horizontal oscillation circuit according to the embodiment of the present invention. As shown in FIG. 5, reference numeral 5 indicates a main computer. Main computer 5 outputs a frequency F corresponding to a user's input mode such as a text mode or a graphic mode. A monitor 20 comprises a microprocessor 11. Microprocessor 11 outputs a voltage F/V corresponding to frequency F inputted thereto. Microprocessor 11 is electrically connected with a horizontal oscillation circuit 22. Horizontal oscillation circuit 22 includes a horizontal oscillator 12 for outputting a certain oscillation voltage, and an operation voltage delaying part 21 for delaying a time period for an operating voltage to reach a voltage level, that is, the level of voltage F/V, and for outputting a delayed operating voltage Vdc. Voltage F/V of microprocessor 11 and a horizontal synchronizing signal Hsync are inputted directly into horizontal oscillator 12. Operating voltage Vdc is inputted into horizontal oscillator 12 through operating voltage delaying part 21. FIG. 8 is a view for showing an operating voltage in detail which is applied to horizontal oscillator of FIG. 1 and to horizontal oscillation circuit of FIG. 5. Operating voltage delaying part 21 comprises a phase delaying part 211 for delaying a phase of operating votage Vdc when operating voltage Vdc is initially inputted, a noise removing part 212 for removing noise from operating voltage Vdc, and a charging/time-delaying part 213 for performing charging/discharging operations at the initial input of operating voltage Vdc and for delaying a time period for operating voltage Vdc to be applied to horizontal oscillator 12 by fully charging enough to a certain level for activating horizontal oscillator 12. Phase delaying part 211 has a variable resistor VR and a coil L1 which are connected in series to each other. When operating voltage Vdc is applied, the phase of operating voltage Vdc is delayed through variable resistor VR and coil L1 of phase delaying part 211 at the start (see "START SECTION" in FIG. 8). Noise removing part 212 has a capacitor C1 connected in parallel with phase delaying part 211. One end of capacitor C1 is connected to ground. Noises contained in the output of phase delaying part 211 are removed by capacitor C1. Charging/time-delaying part 213 has a capacitor C2 connected in parallel with noise removing part 212. One end of capacitor C2 is connected to ground. The output from phase delaying part 211 is charged to a level of operating voltage Vdc by charging/time-delaying part 213. Operating voltage Vdc from charging/time-delaying part 213 is inputted to horizontal oscillator 12 of horizontal oscillation circuit 22. At this time, operating voltage Vdc from charging/time-delaying part 213 is inputted to horizontal oscillator 12 with a time period delayed for charging up to the level of opertaing voltage Vdc in capacitor C2. That is to say, capacitor C2 is gradually charged to the level of operating voltage Vdc. HITACHI HA11235 or DAE-WOO DBL2009 available in the market may be used as horizontal oscillator 12. Horizontal oscillator 12 outputs a stable oscillation voltage corresponding to voltage F/V. The oscillation voltage from horizontal oscillator 12 is inputted to a horizontal driver 13. Horizontal driver 13 generates current according to the oscillation voltage of horizontal oscillator 12. The current outputted from horizontal driver 13 is inputted to a horizontal output circuit 14 and drives horizontal output circuit 14. Horizontal output circuit 14 supplies a horizontal deflection yoke of CRT (not shown) with the required current for a horizontal deflection.

Figure 6:
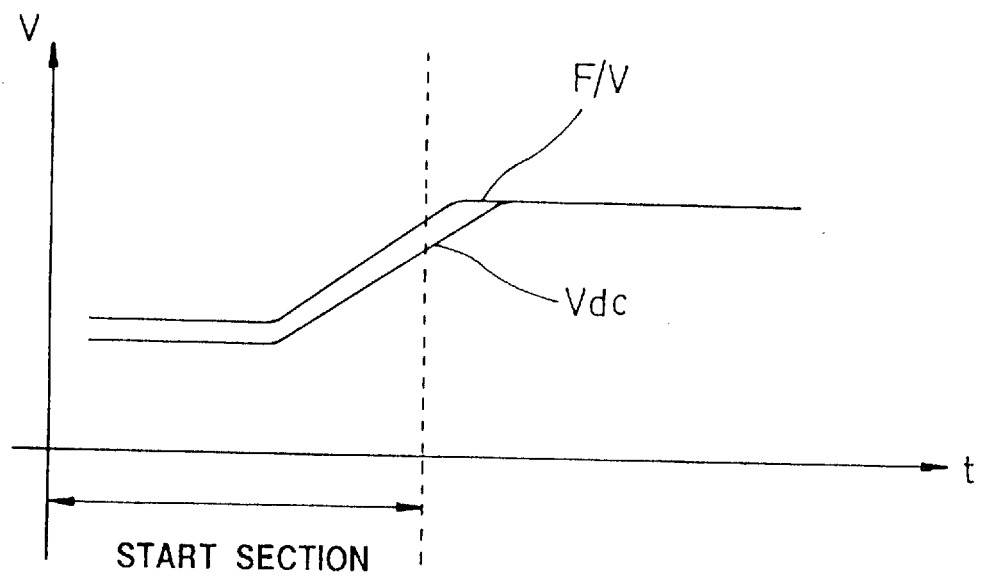
FIG. 6 is a view for showing a relationship between an input mode voltage F/V and an operation voltage Vdc both of which are applied to the horizontal oscillation circuit of FIG. 5.
Figure 7:
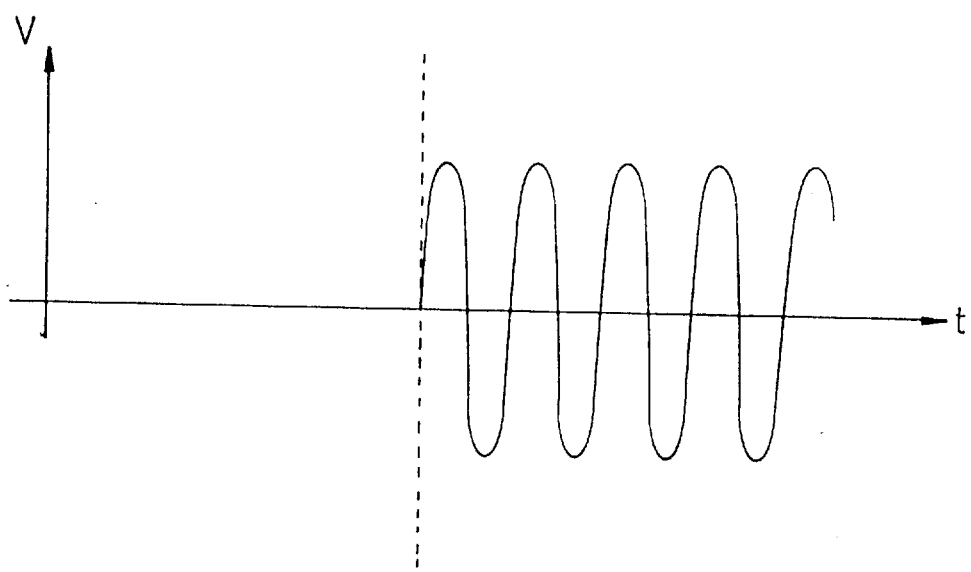
FIG. 7 is a view for showing waveforms outputting from the horizontal oscillation circuit under the relationship between the two voltages of FIG. 6.

FIG. 6 is a view for showing a relationship between an input mode voltage F/V and an operation voltage Vdc both of which are applied to the horizontal oscillation circuit of FIG. 5, and FIG. 7 is a view for showing waveforms outputting from the horizontal oscillation circuit under the relationship between the two voltages of FIG. 6. At the start time such as a power input of a mode change, voltage F/V inputted to horizontal oscillator 12 from microprocessor 11 is maintained higher than operating voltage Vdc (see "START SECTION" in FIG. 6). Voltage F/V of the microprocessor 11 is applied to horizontal oscillation circuit 22 with a certain level in advance before operating voltage Vdc activates horizontal oscillation circuit 22. Therefore, horizontal oscillation circuit 22 performs a normal oscillation without an obnormal oscillation (see "START SECTION" in FIG. 7). Such a normal oscillation of horizontal oscillation circuit 22 allows an appropriate current to flow to a horizontal output transistor (not shown) of horizontal output circuit 14, to thereby prevent horizontal output circuit 14 from being damaged by heat. Further, the normal oscillation of horizontal oscillation circuit 22 enables a monitor to perform a stable display on a screen even at the start time (see (B) of FIG. 4).

Therefore, according to an embodiment of the present invention, a horizontal output circuit of a monitor can be protected from being damaged by heat and a stable display can be obtained even at the start input such as a power input or a mode change.

It is understood that various other modifications will be apparent to and can be readily made by those skilled in the art without departing from the scope and spirit of this invention. Accordingly, it is not intended that the scope of the claims appended thereto be limited to the description as set forth herein, but rather that the claims be constructed as encompassing all the features of patentable novelty that reside in the present invention, including all features that would be treated as equivalents thereof by those skilled in the art to which this invention pertains.

What is claimed is:

1. A horizontal oscillation circuit for a monitor for inputting a voltage corresponding to an operating mode such as a text mode or a graphic mode, a horizontal synchronizing signal and an operating voltage and for outputting an oscillation voltage, comprising an operation voltage delaying part for delaying a time period for the operating voltage to reach a voltage level and for outputting a delayed operating voltage; and a horizontal oscillator for inputting the voltage corresponding to the operating mode, the horizontal synchronizing signal and the delayed operating voltage and for outputting a stable oscillation voltage corrresponding to the operating mode.

2. The horizontal oscillation circuit as claimed in claim 1, wherein said operation voltage delaying part comprises:

a phase delaying portion for delaying a phase of the operating voltage when the operating voltage is inputted at a start;

a noise removing portion for removing noise of the operating voltage; and a charging/time-delaying portion for performing charging/discharging operations at the start of the operating voltage and for delaying a time period for operating voltage to be applied to said horizontal oscillator by fully charging to a certain level for activating said horizontal oscillator.

3. The horizontal oscillation circuit as claimed in claim 2, wherein said phase delaying portion includes a variable resistor and a coil which are connected in series to each other, said variable resistor inputs the operating voltage, and one end of said coil is connected to an operating voltage input terminal of said horizontal oscillator.

4. The horizontal oscillation circuit as claimed in claim 2, wherein said noise removing portion includes a first capacitor connected in parallel with said phase delaying portion and one end of said first capacitor is connected to ground.

5. The horizontal oscillation circuit as claimed in claim 2, wherein said charging/time-delaying portion includes a first capacitor connected in parallel with said noise removing portion and one end of said second capacitor is connected to ground.

6. A horizontal oscillation circuit for a monitor for inputting a voltage corresponding to an operating mode such as a text mode or a graphic mode, a horizontal synchronizing signal and an operating voltage and for outputting an oscillation voltage, comprising:

- a horizontal oscillator for inputting the voltage corresponding to the operating mode, the horizontal synchronizing signal and a delayed operating voltage and for outputting a stable oscillation voltage corrresponding to the operating mode;
- a phase delaying portion for delaying a phase of the operating voltage when the operating voltage is inputted at a start;
- a noise removing portion for removing noise of the inputted operating voltage; and
- a charging/time-delaying portion for performing charging/discharging operations at the start of operating voltage and for delaying a time period for operating voltage to be applied to said horizontal oscillator by fully charging to a certain level for activating said horizontal oscillator.

7. A monitor with a horizontal oscillation circuit for inputting a voltage corresponding to an operating mode such as a text mode or a graphic mode, a horizontal synchronizing signal and an operating voltage and for outputting an oscillation voltage, comprising:

- an operation voltage delaying part for delaying a time period for the operating voltage to reach a voltage level and for outputting a delayed operating voltage; and
- a horizontal oscillator for inputting the voltage corresponding to the operating mode, the horizontal synchronizing signal and the delayed operating voltage and for outputting a stable oscillation voltage corrresponding to the operating mode.

8. The monitor as claimed in claim 7, wherein said operation voltage delaying part comprises:

- a phase delaying portion for delaying a phase of the operating voltage when the operating voltage is inputted at a start;
- a noise removing portion for removing noise of the operating voltage; and
- a charging/time-delaying portion for performing charging/discharging operations at the start of the operating voltage and for delaying a time period for operating voltage to be applied to said horizontal oscillator by fully charging to a certain level for activating said horizontal oscillator.

9. The monitor as claimed in claim 8, wherein said phase delaying portion includes a variable resistor connected in series with a coil, said variable resistor inputs the operating voltage, and one end of said coil is connected to the operating voltage input terminal of said horizontal oscillator.

10. The monitor as claimed in claim 8, wherein said noise removing portion includes a first capacitor connected in parallel with said phase delaying portion and one end of said first capacitor is connected to ground.

11. The monitor as claimed in claim 8, wherein said charging/time-delaying portion includes a first capacitor connected in parallel with said noise removing portion and one end of said second capacitor is connected to ground.

12. A monitor with a horizontal oscillation circuit for inputting a voltage corresponding to an operating mode such as a text mode or a graphic mode, a horizontal synchronizing signal and an operating voltage and for outputting an oscillation voltage, comprising:

- a horizontal oscillator for inputting the voltage corresponding to the operating mode, the horizontal synchronizing signal and a delayed operating voltage and for outputting a stable oscillation voltage corrresponding to the operating mode;
- a phase delaying portion including a variable resistor connected in series with a coil, wherein said variable resistor inputs the operating voltage and one end of said coil is connected to an operating voltage input terminal of said horizontal oscillator;
- a noise removing portion including a first capacitor connected in parallel with said phase delaying portion, wherein one end of said first capacitor is connected to ground; and
- a charging/time-delaying portion including a second capacitor connected in parallel with said noise removing portion, wherein one end of said second capacitor is connected to ground.

* * * * *